United States Patent
Aisenbrey

(10) Patent No.: US 7,079,086 B2
(45) Date of Patent: *Jul. 18, 2006

(54) LOW COST ELECTROMAGNETIC FIELD ABSORBING DEVICES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 21 days.

This patent is subject to a terminal disclaimer.

(21) Appl. No.: 10/863,407

(22) Filed: Jun. 8, 2004

(65) Prior Publication Data

US 2004/0239578 A1    Dec. 2, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,774, filed on Jun. 16, 2003, provisional application No. 60/478,918, filed on Jun. 16, 2003, provisional application No. 60/461,877, filed on Apr. 10, 2003, provisional application No. 60/269,414, filed on Feb. 16, 2001, provisional application No. 60/268,822, filed on Feb. 15, 2001.

(51) Int. Cl.
*H01Q 1/42* (2006.01)

(52) U.S. Cl. ..................... 343/872; 343/841

(58) Field of Classification Search ........... 343/872
See application file for complete search history.

(56) References Cited

U.S. PATENT DOCUMENTS

| | | | | |
|---|---|---|---|---|
| 5,338,617 | A | 8/1994 | Workinger et al. | 428/551 |
| 6,741,221 | B1 | 5/2004 | Aisenbrey | 343/897 |
| 6,870,516 | B1 * | 3/2005 | Aisenbrey | 343/873 |
| 2002/0160193 | A1 | 10/2002 | Hajmrle et al. | 428/403 |
| 2002/0162672 | A1 | 11/2002 | Cook et al. | 174/35 R |
| 2004/0206615 | A1 * | 10/2004 | Aisenbrey | 200/262 |
| 2005/0001780 | A1 * | 1/2005 | Aisenbrey | 343/873 |
| 2005/0006126 | A1 * | 1/2005 | Aisenbrey | 174/68.1 |

* cited by examiner

Primary Examiner—Trinh Dinh
Assistant Examiner—Binh Van Ho
(74) Attorney, Agent, or Firm—Douglas R. Schnabel

(57) ABSTRACT

Electromagnetic absorbing devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

52 Claims, 8 Drawing Sheets

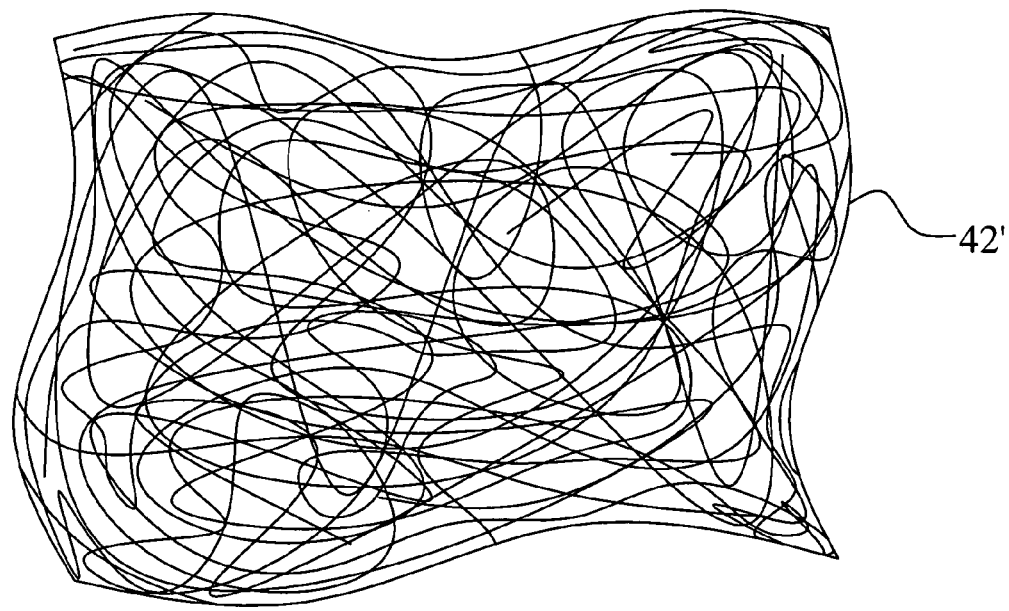
FIG. 5b
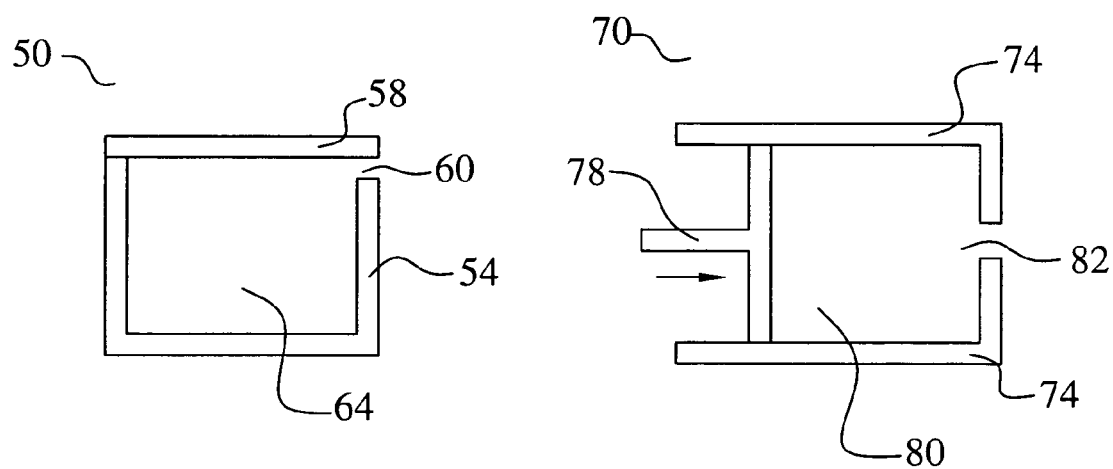
FIG. 6a
FIG. 6b

LOW COST ELECTROMAGNETIC FIELD ABSORBING DEVICES MANUFACTURED FROM CONDUCTIVE LOADED RESIN-BASED MATERIALS

This Patent Application claims priority to the U.S. Provisional Patent Application 60/461,877, filed on Apr. 10, 2003 and to the U.S. Provisional Patent Application 60/478,774, filed on Jun. 16, 2003 which are herein incorporated by reference in their entirety.

This Patent Application is a Continuation-in-Part filed as U.S. patent application Ser. No. 10/309,429, filed on Dec. 4, 2002 now U.S. Pat. No. 6,870,516, also incorporated by reference in its entirety, which is a Continuation-in-Part application filed as U.S. Patent Application Ser. No. 10/075,778, filed on Feb. 14, 2002 now U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to electromagnetic field absorbing devices and, more particularly, to electromagnetic field absorbing devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s)

(2) Description of the Prior Art

Electromagnetic interference (EMI) is a significant issue in electronic circuits and systems. Electromagnetic energy is present at all times. For example, energy from the sun is transmitted to the earth by electromagnetic energy. Further, wireless communications systems rely on electromagnetic waves to carry voice/data/video information over long distances without the benefit of direct wire connection. While electromagnetic energy is beneficial in a variety of ways, at least two problems are relevant to the art of electronic circuits and systems.

First, electronic circuits and/or systems can radiate substantial electromagnetic energy whether intentionally, as in the case of a broadcasting wireless device such as a mobile phone, or unintentionally, as in the case of a digital microprocessor operating at a very high frequency. In either case, rapid and periodic changes in current flow direction result in radiation of electromagnetic energy from the circuit device. This electromagnetic interference (EMI) may be in a broad band or a narrow band of frequencies. The emission of substantial electromagnetic energy from the circuit device may cause no direct difficulties with the operation of that circuit device but may create a local operating environment with excessive levels of electromagnetic energy. Second, electronic circuits and/or systems may be overly sensitive to EMI present in the operating environment. That is, environmental levels of electromagnetic energy may cause faulty operation of the circuit. For example, an automobile has a microprocessor-based system to control fuel and ignition for the vehicle engine. In addition, the automobile has a radio receiver. It is found in the art that the radio receiver may exhibit poor tuning and/or sound quality due to EMI or radio frequency interference (RFI) radiating from the engine control circuit. In this case, the engine control system may be radiating excessive EMI, or the radio receiver may be overly susceptible to EMI in a particular frequency range, or a combination of these effects may be occurring. An important object of the present invention is to provide a means to reduce EMI/RFI radiation from electronic circuits and systems. A second important object of the present invention is to provide a means to reduce EMI/RFI susceptibility of electronic circuits and systems.

Several prior art inventions relate to electromagnetic interference materials and methods. U.S. patent application Ser. No. 2002/0162672 A1 to Cook et al teaches the use of a doped synthetic polymer material for packaging of power electric assemblies. This invention uses such materials as nickel, carbon fiber or aluminum in a polymer matrix. This invention also teaches the use of a doped synthetic polymer material for heat dissipation. U.S. Pat. No. 5,338,617 to Workinger et al teaches a method of insulating metal powder particles that is suitable for incorporation into plastic resins for subsequent casting to form radio frequency shields having high DC resistance. This also teaches the combining of the metal powder with thermosetting or thermoplastic materials including olefins, flouroplastics, polyamides, polyesters, silicone rubber, urethane, acrylics and/or polycarbonates to provide a conductively loaded plastic material. In particular, carbonyl iron (Fe(CO)$_5$) is used as the metal powder. U.S. patent application U.S. Ser. No. 2002/0160193 A1 to Hajmrly et al teaches the use of conductive fillers and conductive polymers in forming EMF shielding. The conductive fillers used in this invention comprise a noble metal coating formed over a non-noble metal coating formed over a carbon-based core. In addition, copper or nickel powders used as conductive fillers are described in the prior art discussion.

SUMMARY OF THE INVENTION

A principal object of the present invention is to provide an effective electromagnetic absorbing device.

A further object of the present invention is to provide a method to form an electromagnetic absorbing device.

A further object of the present invention is to provide an electromagnetic absorbing device molded of conductive loaded resin-based materials.

A yet further object of the present invention is to provide an electromagnetic absorbing device molded of conductive loaded resin-based material where the characteristics can be altered by forming a metal layer over the conductive loaded resin-based material.

A yet further object of the present invention is to provide methods to fabricate an electromagnetic absorbing device from a conductive loaded resin-based material incorporating various forms of the material.

A yet further object of the present invention is to provide a method to fabricate an electromagnetic absorbing device from a conductive loaded resin-based material where the material is in the form of a fabric.

A yet further object of the present invention is to provide an electromagnetic absorbing device that is easily incorporated into the casing of an electronics circuit.

A yet further object of the present invention is to provide an electromagnetic absorbing chamber for electronics product testing.

A yet further object of the present invention is to provide an electromagnetic absorbing device that mimics a human body part.

In accordance with the objects of this invention, an electromagnetic absorbing device is achieved. The device comprises a conductive loaded, resin-based material comprising conductive materials in a base resin host. The ratio, by weight, of the conductive materials to the resin host is between about 0.20 and about 0.40.

Also in accordance with the objects of this invention, a mobile communications device is achieved. The device comprises an electronic circuit and an electromagnetic absorbing device. The electromagnetic absorbing device comprises a conductive loaded, resin-based material comprising conductive materials in a base resin host. The ratio, by weight, of the conductive materials to the resin host is between about 0.20 and about 0.40. The electromagnetic absorbing device comprises a part of the casing for the mobile communications device.

Also in accordance with the objects of this invention, an electromagnetic absorbing device is achieved. The device comprises a conductive loaded, resin-based material comprising conductive materials in a base resin host. The ratio, by weight, of the conductive materials to the resin host is between about 0.20 and about 0.40. The electromagnetic absorbing device mimics a part of the human body.

Also in accordance with the objects of this invention, a method to form an electromagnetic absorbing device is achieved. The method comprises providing a conductive loaded, resin-based material comprising conductive materials in a resin-based host. The conductive loaded, resin-based material is molded into an electromagnetic absorbing device.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold EMI absorbing devices of a conductive loaded resin-based material.

DESCRIPTION OF THE PREFERRED EMBODIMENTS

Figure 1A:
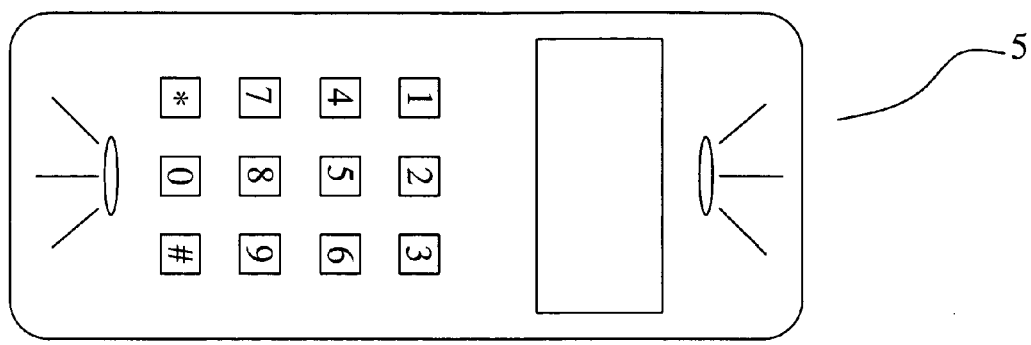
FIGS. 1a through 1c illustrate a first preferred embodiment of the present invention showing a mobile phone with EMI absorbing device comprising a conductive loaded resin-based material.

This invention relates to electromagnetic field absorbing devices molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of EMI absorbing devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the EMI absorbing devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of EMI absorbing devices significantly lowers the cost of materials and the design and manufacturing processes used to hold ease of close tolerances, by forming these materials into desired shapes and sizes. The EMI absorbing devices can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the EMI absorbing devices. The doping composition and directionality associated with the micron conductors within the loaded base resins can affect the electrical and structural characteristics of the EMI absorbing devices, and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming EMI absorbing devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in EMI absorbing applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductive loaded resin-based material exhibits excellent thermal dissipation characteristics. Therefore, EMI absorbing devices manufactured from the molded conductive loaded resin-based material can provide added thermal dissipation capabilities to the application. For example, heat can be dissipated from electrical devices physically and/or electrically connected to an EMI absorbing device of the present invention.

Figure 1B:
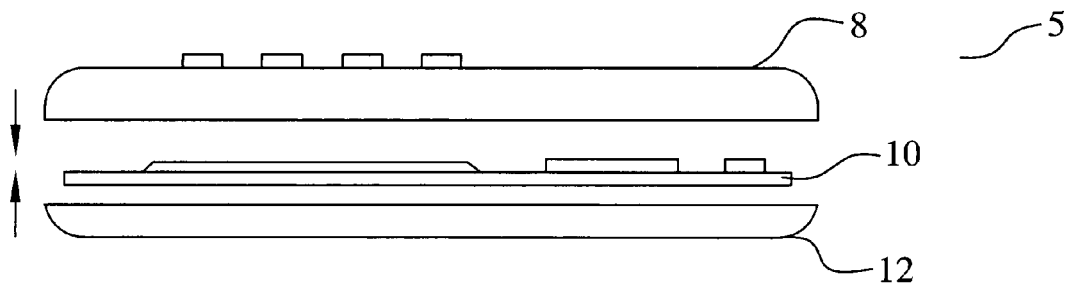
Figure 1C:
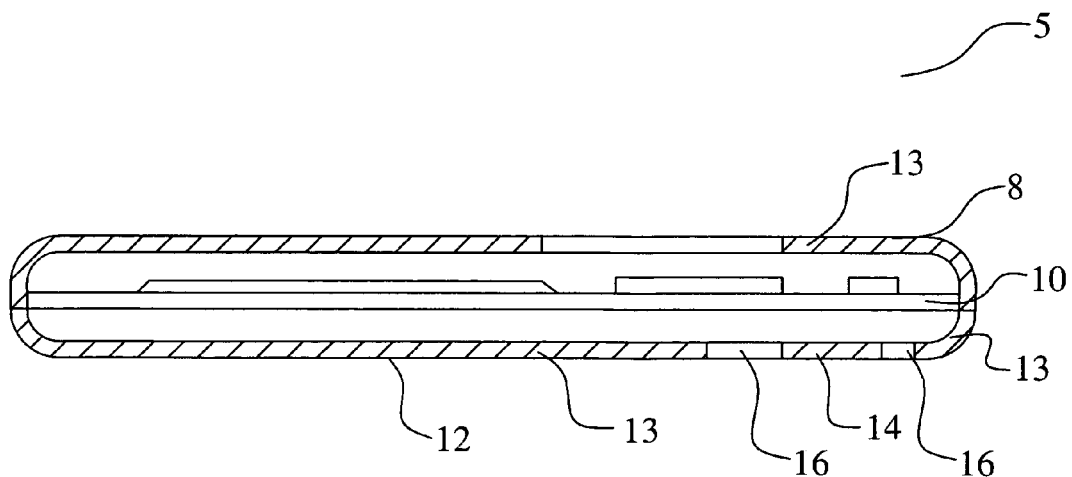

Referring now to FIGS. 1a through 1c, a first preferred embodiment of the present invention is illustrated. Several important features of the present invention are shown and discussed below. In particular, a mobile phone device 5 is shown with an integrated EMI absorbing device 13 comprising the conductive loaded resin-based material according to the present invention. As shown in the side view of FIGS. 1a and 1b, the mobile phone device 5 comprises an inner electronics system board 10, a case top 8 and a case bottom 12. When the mobile phone device 5 is assembled, the case top 8 and bottom 12 fully enclose the system board 10. As an important feature of the present invention, the top and bottom of the case 8 and 12 are formed, at least in part, of the conductive loaded resin-based material as described herein.

In normal operation, a mobile phone device transmits and receives electromagnetic energy carrying voice and data information to and from the phone. Furthermore, the phone typically utilizes an antenna to carry out this transceiving process. Very low power electromagnetic energy from a far field source, such as a cellular telephone tower, is received into this antenna. This energy causes electrical oscillation within the antenna mirroring the broadcast signal. In turn, this electrical oscillation is transferred into the electronics circuit of the mobile phone where it is processed/decoded and the voice and data information reproduced for the user. Alternatively, the mobile phone encodes voice and data information from the phone user into an oscillating electrical signal that is then transferred onto the antenna. This transmitting electrical oscillation in the antenna, in turn, generates electromagnetic energy that is broadcast out from the mobile phone.

Several features of the mobile phone 5 of the present invention should be noted. First, the phone case comprises a top section 8 and a bottom section 12. The top section 8 contains the key pad, display, microphone openings, and speaker openings and is the part of the phone typically oriented toward the user's head during a phone call. Conversely, the bottom section 12 is typically oriented away from the user's head during a phone call. Second, the antenna 14 is preferably, though not essentially, formed into the case bottom 12. Third, a novel absorbing layer 13, or device, is formed into the case top 8 and much of the case bottom 12. Fourth, the absorbing layer 13 preferably comprises the conductive loaded resin-based material of the present invention. More preferably, the antenna layer 14 also comprises the conductive loaded resin-based material. Fifth, the antenna 14 and the absorbing layer 13 are separated by an insulating region 16 in the phone case 12. Sixth, as a most preferred embodiment, the insulating region comprises a resin-based material. In this case, the antenna 14, insulating region 16, and absorbing device 13 are formed by molding and, more preferably, by injection molding. The resulting phone case 8 and 12 provides environmental and physical protection of the mobile phone 5 and provides significant antenna and EMI absorption functionality.

The conductive loaded resin-based material of the present invention possesses a conductive resin lattice structure that maximizes absorption of RF/EM energy incident from an external source. It is this same capability that, in part, facilitates the excellent signal reception capabilities of the conductive loaded resin-based antenna 14. In the present invention, the conductive loaded resin-based EMI absorbing device 13 that is formed into the top and bottom parts of the case 8 and 12 effectively absorbs most of the EMI radiated emissions coming from within the phone 5. The absorption of EMI radiated emissions enables the mobile phone 5 to thereby comply with Federal Communication Commission (FCC) guidelines under Class B communications devices. Further, the absorbing device 13 reduces the specific absorption rate (SAR) of the phone 5. SAR is a measure of the amount of power radiated and absorbed in a unit mass of human body tissue. By integrating the absorbing device 13 into the phone case 8 and 12, the SAR of the phone 5 is reduced to thereby reduce human body interference with phone transmission and reception and to thereby reduce human body exposure to electromagnetic energy. The resulting absorbing device 13 has properties of low weight, corrosion and water resistance, and moldability comparable to base resin material. However, these properties are combined with excellent electrical and thermal conductivity and, most importantly, with excellent absorption of electromagnetic energy.

In the prior art, the problem of EMI radiated emissions is typically solved using an EMI shield or can. EMI shields have typically been constructed of metal sheeting. These shields can be very effective but tend to be very expensive and add excessive weight and volume to the product. Further, prior art EMI shields do not absorb the electromagnetic energy. Rather, the energy is reflected away from or is reflected within the shield. Any electromagnetic energy reflected within the shield is effective trapped inside the shield and must then be dissipated. Unfortunately, this energy will tend to be dissipated by interactions with electronic components within the shield. Such shielding devices can effectively deal with the FCC radiated emissions requirements but may create other problems due to these internal EMI interactions. In addition, typical shields add substantial cost and limitations to the product design. Alternatively, conductive paints have been developed that can be applied to the inside of the electronic package, such as the case top 8 and bottom 12, to act as EMI shielding. These paints do not add substantial product volume or weight. However, these shielding paints also will reflect electromagnetic energy rather than absorbing it. Therefore, shielding paints do not solve the problem of internal interactions with radiated EMI. Further, shielding paints tend to be very expensive and require special application tooling and processes.

By comparison, the absorbing device or structure 13 of the present invention offers several distinct advantages over the prior art. First, the conductive loaded resin-based material absorbs the electromagnetic energy. By grounding the novel absorbing device 13, the EMI energy radiated from internal phone 5 components, as well as that radiated toward the top section of the phone 5 by the antenna 14, is absorbed and dissipated to ground. Second, the absorbing device 13 is easily molded into the product case 8 and 12 with very minimal weight difference between the conductive loaded resin-based material and any resin-based material that would typically be used for the phone case 8 and 12. Therefore, the absorbing device 13 provides part of the phone structure 8 and 12. Third, the absorbing device 13 provides a much lower cost and more flexible alternative to shielding with metal sheets or with conductive paints. Special tooling and processes and case volume are avoided.

The use of the conductive loaded resin-based material of the present invention allows the EMI absorbing device 13 to be easily molded into the top side mobile phone shape 8. For example, the conductive loaded resin-based material may be injection molded into the top case section shape 8. The absorbing device 13 can easily be coated or over-molded with an insulating layer if this is desired. The bottom case section 12 can be formed using multiple injection molding and/or over-molding steps. For example, the antenna 14 and absorbing device 13 may comprise the same conductive loaded resin-based material and may be injection molded in a single step with a previously molded insulating region 16 inserted between the antenna 14 and absorbing device 13 to prevent shorting.

Figure 7:
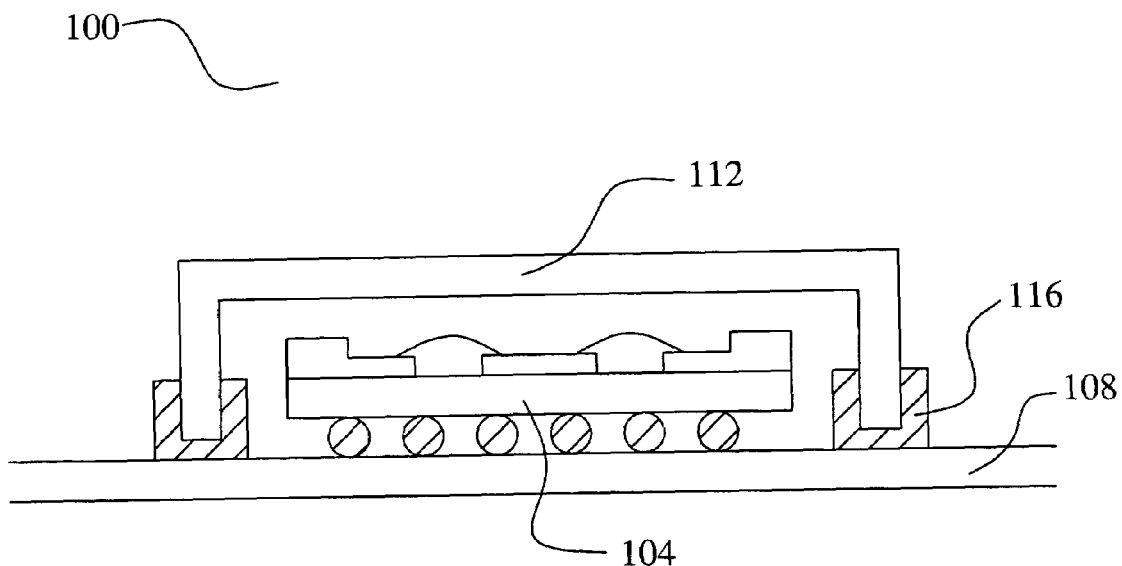
FIG. 7 illustrates a second preferred indictment of the present invention showing an EMI absorbing device of the conductive loaded resin-based material overlying an integrated circuit device.

Referring now to FIG. 7, a second preferred embodiment of the present invention is illustrated. An EMI absorbing device 112 for an integrated circuit device 104 is shown. In this example, a packaged integrated circuit device 104 is mounted onto a circuit board substrate 108. A ball grid array (BGA) type package is shown, but it is understood that any type of chip carrier, including dual in-line packages (DIP), surface mounted devices (SMD), through-hole devices, wire-bonded die devices, flip chip devices, and the like, may be used. The EMI absorbing device 112, or absorbing can, encloses the integrated circuit device 104 and, again, comprises the conductive loaded resin-based material according to the present invention. The conductive loaded resin-based material provides excellent absorption of electromagnetic energy radiating from the integrated circuit device 104 or radiating from a source external to the integrated circuit device 104. EMI energy incident upon the absorbing device 112 generates currents within the conductive resin lattice structure. These currents are then conducted to a ground reference.

In the exemplary case, the absorbing device 112 is grounded to the circuit board substrate 108 through contact points between the absorbing device 112 and the substrate 108. Further, the contact points are further enhanced with a solderable layer 116 that is formed overlying the absorbing surface. This solderable layer 116 comprises a metal material that is formed onto the absorbing device 112 in any of several ways. For example, the solderable layer 116 may be formed by plating or by coating. If the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The solderable layer 116 may be formed by, for example, electroplating or physical vapor deposition.

Figure 8A:
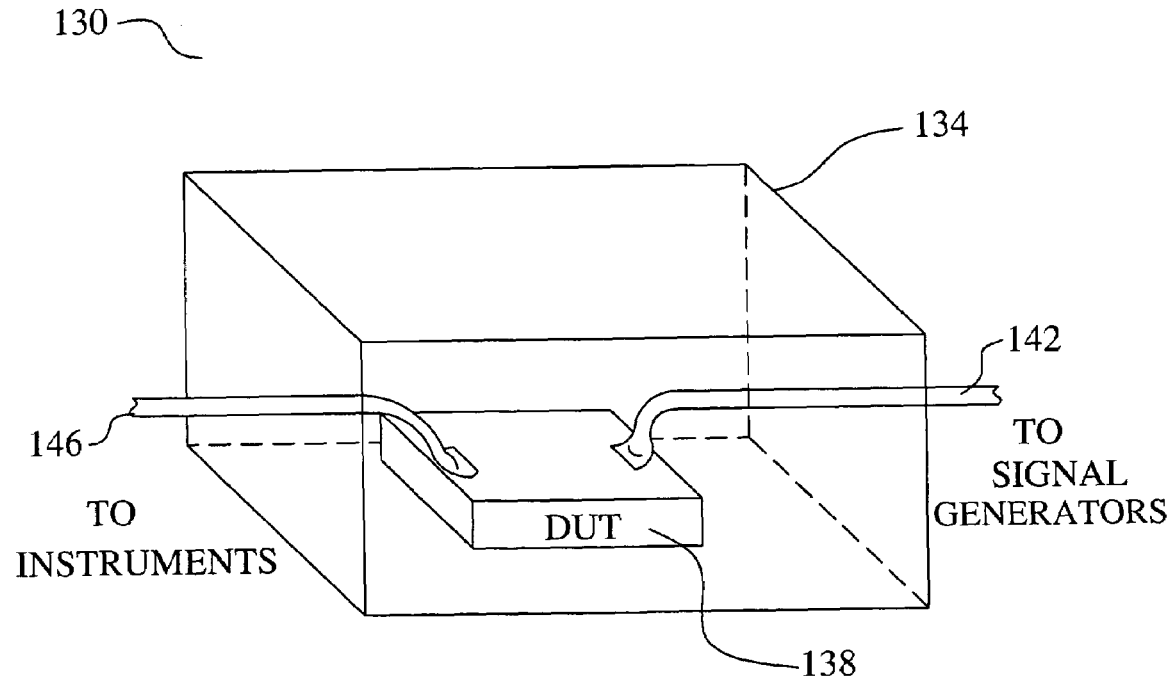
FIGS. 8a and 8b illustrate a third preferred embodiment of present invention showing an EMI absorbing apparatus useful for isolating a device under test (DUT).
Figure 8B:
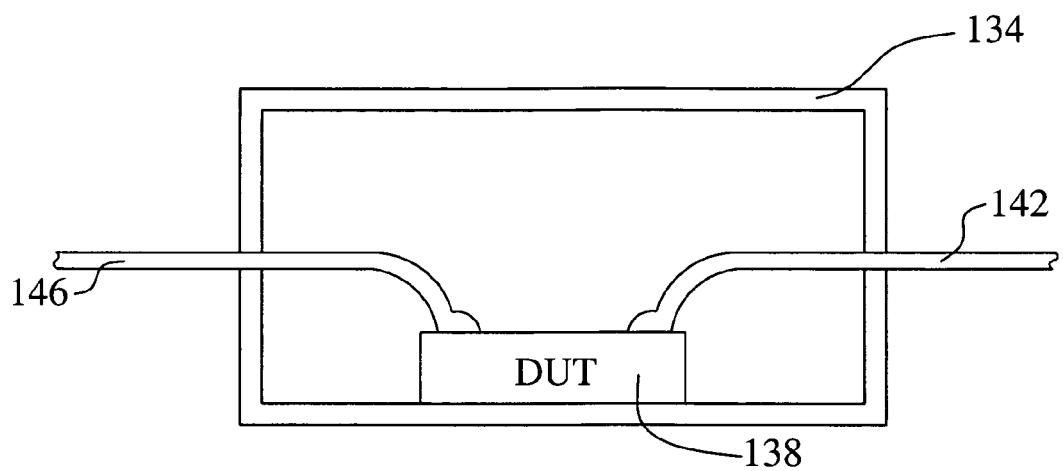

Referring now to FIGS. 8*a* and 8*b,* a third preferred embodiment of the present invention is illustrated. In this case, an EMI absorbing apparatus 134 for completely enclosing a device under test (DUT) is shown. It is common in the art of electronic circuits and systems to perform extensive functional and parametric testing of products prior to high volume production. This testing is typically performed over a range of environmental and manufacturing conditions such as temperature, power supply, process variation, and electromagnetic interference. In this embodiment, an electronic circuit is the device under test (DUT) 138 that is placed into a chamber 134. The chamber 134 comprises the conductive loaded resin-based material of the present invention. Control signals 142 and monitoring signals 146 are routed into and out of the chamber 134 and connected to the DUT 138.

The EMI absorbing chamber 134 preferably comprises a hollow box of the conductive loaded resin-based material such that the DUT 138 is completely contained within the chamber 134. This chamber and DUT arrangement is useful, for example, for characterizing the EMI emitted from the DUT 138. In this case, the excellent electromagnetic absorption of the chamber material 134 allows external EMI energy to be absorbed by the absorbing device 134 such that a relatively low EMI environment is created within the chamber 134. As a result, monitoring instrumentation 146 can detect the spectrum of EMI generated by the DUT 138. Alternatively, the EMI absorbing chamber 134 may be used to test the DUT 138 susceptibility to environmental EMI using a well-controlled test. Since the chamber 134, if grounded, effectively isolates the interior space within the chamber, it is possible to introduce a carefully controlled EMI emitting source, not shown, into the chamber to thereby test the response of the DUT 138 to this controlled EMI source. Finally, the EMI absorbing chamber 134 of this embodiment is further extended to create an absorbing structure 134 to prevent any EMI energy radiating from the DUT 138 from escaping into the nearby environment. This absorbing chamber 134 may again be formed using an injection molding method, or by performing an extrusion molding to create chamber sides and then assembling the sides into a completed box 134.

Figure 9A:
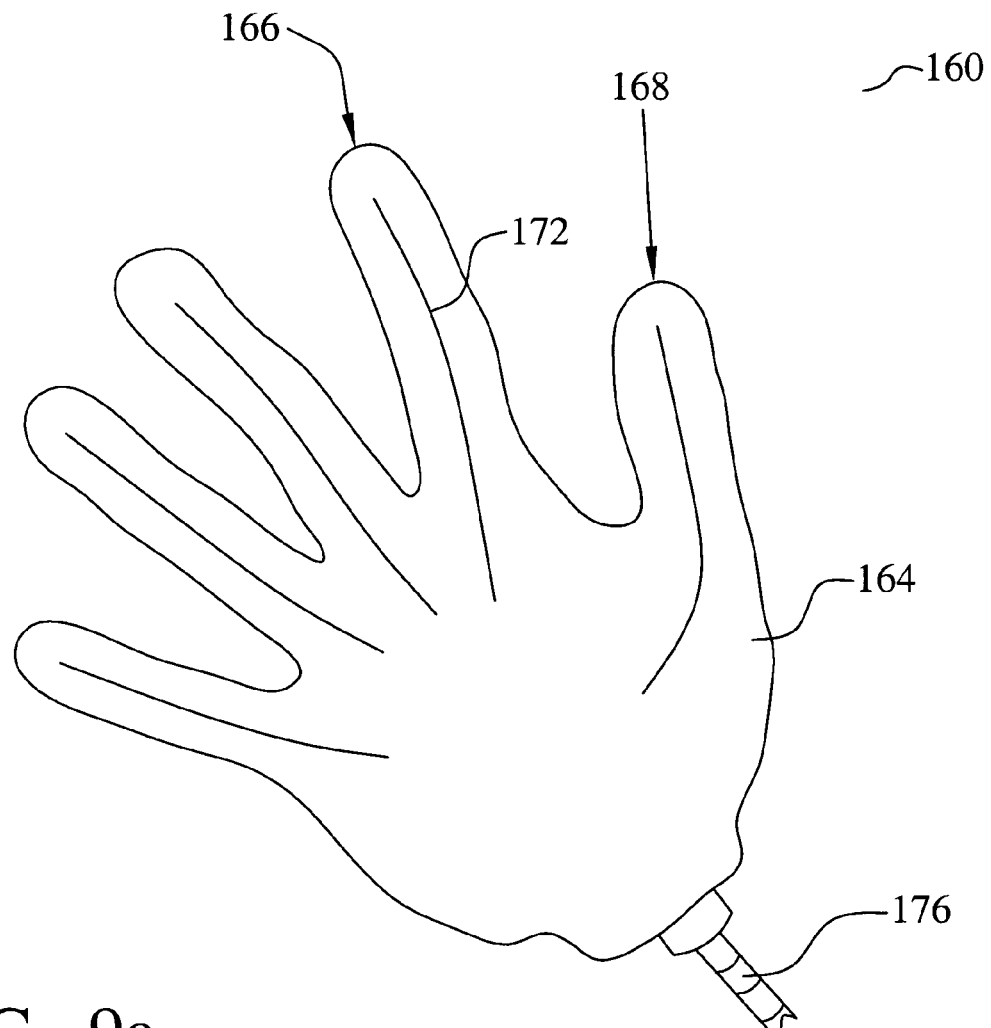
FIGS. 9a and 9b illustrate a fourth preferred embodiment of the present invention showing an apparatus to simulate the electromagnetic performance of a human hand for use in testing an electronic device.
Figure 9B:
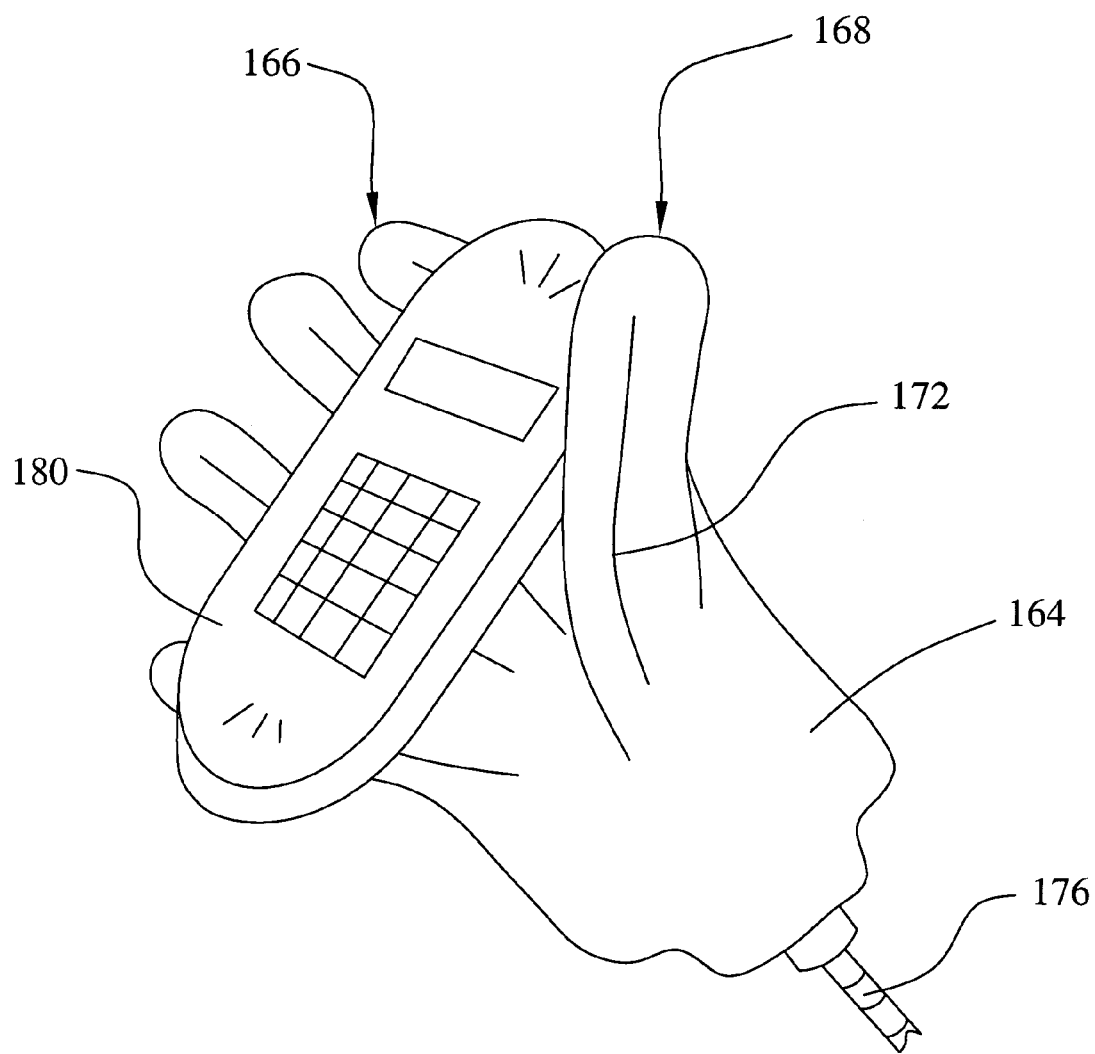

Referring now to FIGS. 9a and 9b, a fourth preferred embodiment of the present invention is illustrated. An apparatus 160 to simulate the electromagnetic performance of a human hand is constructed of the conductive loaded resin-based material of the present invention. In a wireless communication device, such as a mobile phone 180, proper operation depends upon consistent performance of the antenna structure to receive and to transmit voice/data information. It is found that physical interaction between the human user and the phone 180 will cause changes in antenna performance. Mobile phones 180 are typically held in the user's hand in close proximity to the user's head. Therefore, the phone 180 is likely to experience significant human interaction on both the top and bottom sides. A particularly important aspect of this interaction is absorption of electromagnetic energy by the user's hand and/or head and the effect that this has on the antenna performance of the phone.

As an important feature of the present invention, a hand simulation device 160 is constructed of the conductive loaded resin-based material according to the present invention. In particular, the hand simulator comprises fingers 166 and a thumb 168 capable of holding a mobile phone 180 or any other device under test (DUT). In the most preferred embodiment, the conductive loaded resin-based material comprises a base resin that is flexible after molding. Further, flexible tendons 172 are embedded into the conductive loaded resin-based material 164 to facilitate shaping the fingers 166 and thumb 168 of the hand into poses that simulate product 180 use by a human. Finally, the hand simulator 160 has a mounting or supporting structure 176 to allow the hand 160 to be freely placed in testing stands and/or chambers. The conductive loaded resin-based material of the hand simulator 160 exhibits an EMI energy absorption characteristic that is similar to that of a human hand in the typical frequency ranges of interest. Therefore, the hand 160 simulates the effect on antenna performance, reception, and transmission of a person holding the phone.

Figure 10:
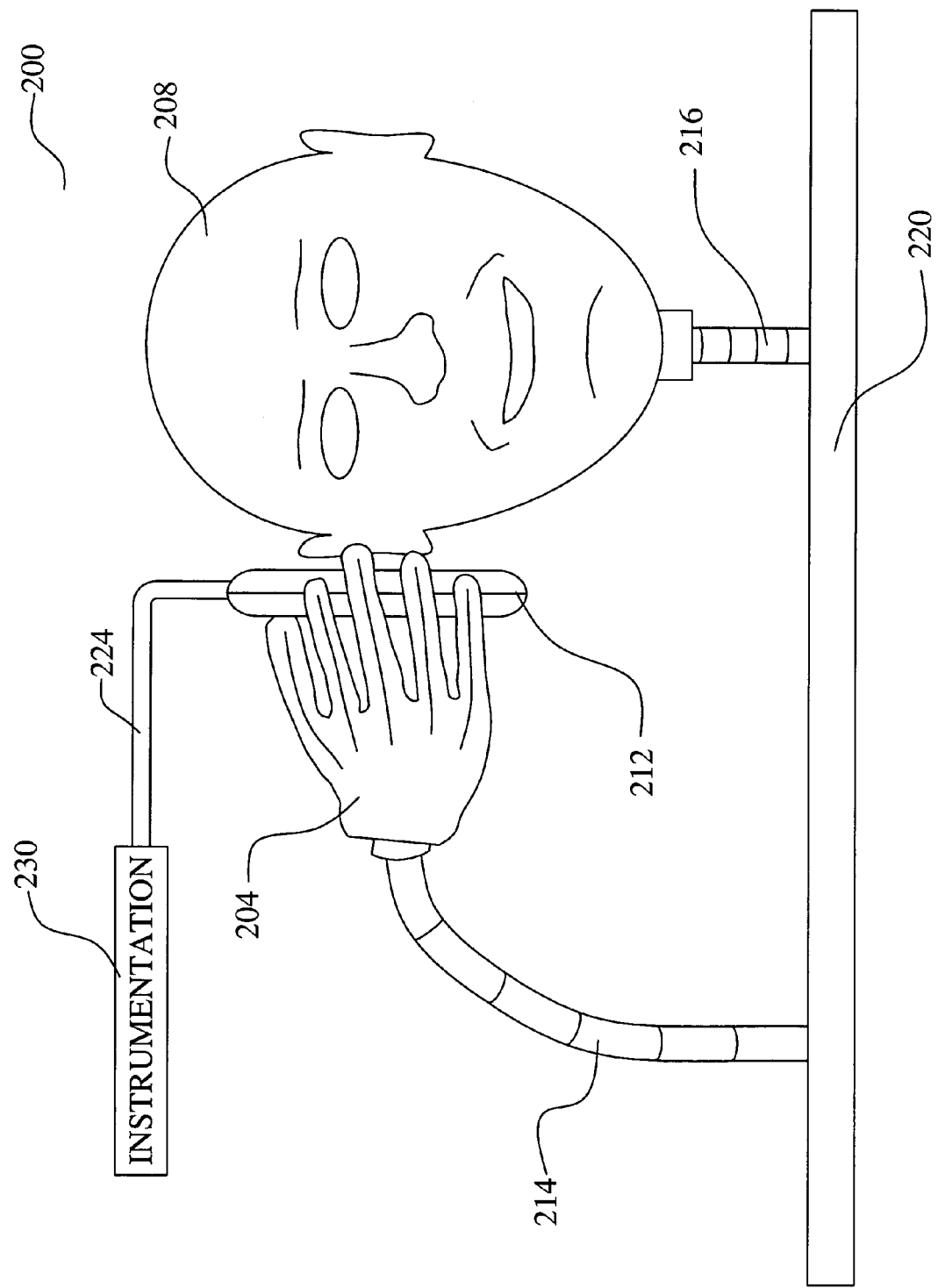
FIG. 10 illustrates a fifth preferred embodiment of the present invention showing an apparatus to simulate the electromagnetic performance of a human hand and of a human head for use in testing an electronic device.

Referring now to FIG. 10, a fifth preferred embodiment of the present invention is illustrated. In this case, the hand simulator concept is extended to a combined hand 204 and head 208 simulator system 200. As in the previous embodiment, the hand simulator 204 comprises the conductive loaded resin-based material of the present invention. In this case, however, a head simulator 208 is added to the test system 200. The head simulator 208 also comprises the conductive loaded resin-based material. The hand 204 and head 208 are secured by supports 214 and 216 to a testing table 220. The mobile phone 212 is held by the hand simulator 204 in the typical operating position near the head 208. Testing instrumentation 230 is connected 224 to the mobile phone device 212 to evaluate the effects of the head and hand simulator 200 on electromagnetic performance. Finally, the concept may be further extended to the formation of a complete human simulator comprising the conductive loaded resin-based material. The hand 204 or head 208 can be easily formed using injection molding techniques.

Figure 2:
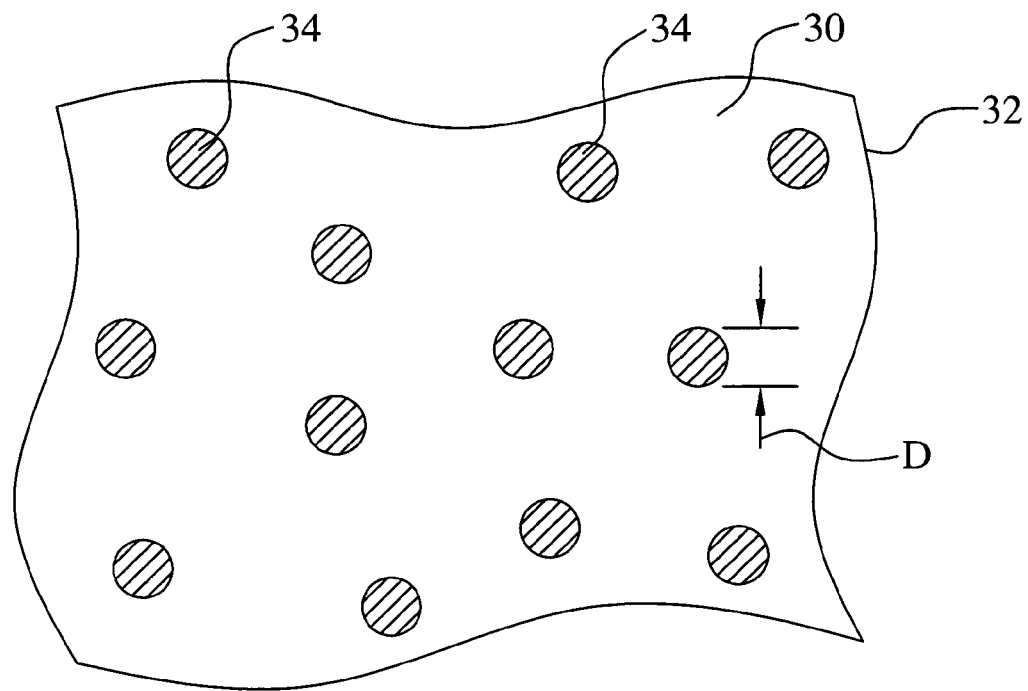
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductive loaded resin-based material 32 having powder of conductor particles 34 in a base resin host 30. In this example the diameter D of the conductor particles 34 in the powder is between about 3 and 12 microns.

Figure 3:
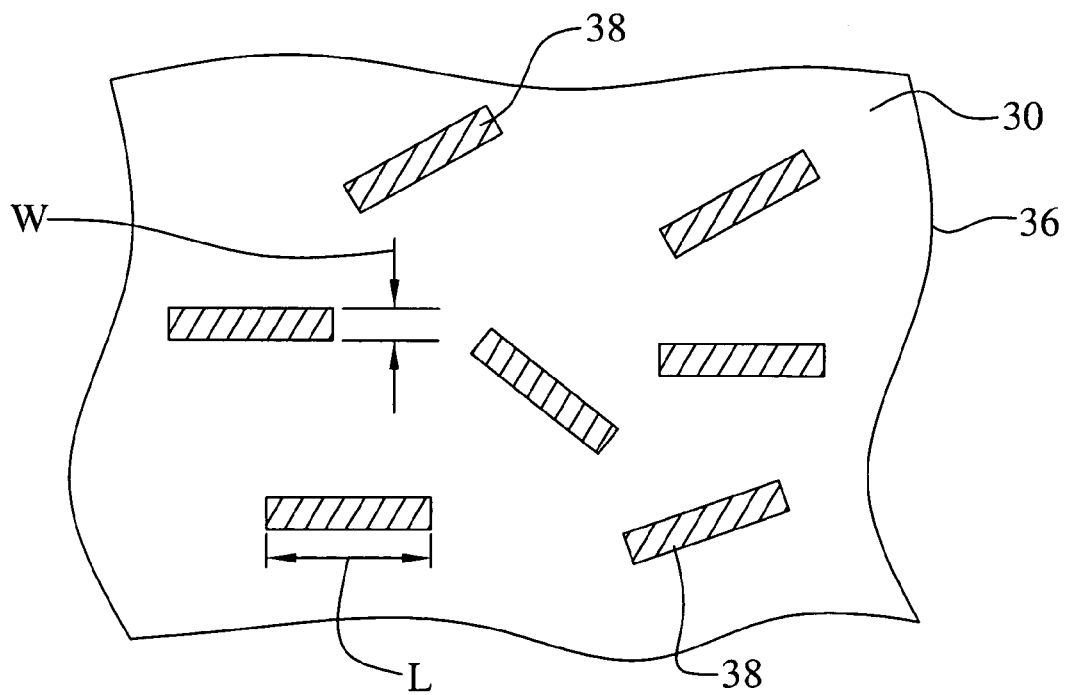
FIG. 3 illustrates a second preferred embodiment of a conductive loaded resin-based material wherein the conductive materials comprise micron conductive fibers.
Figure 4:
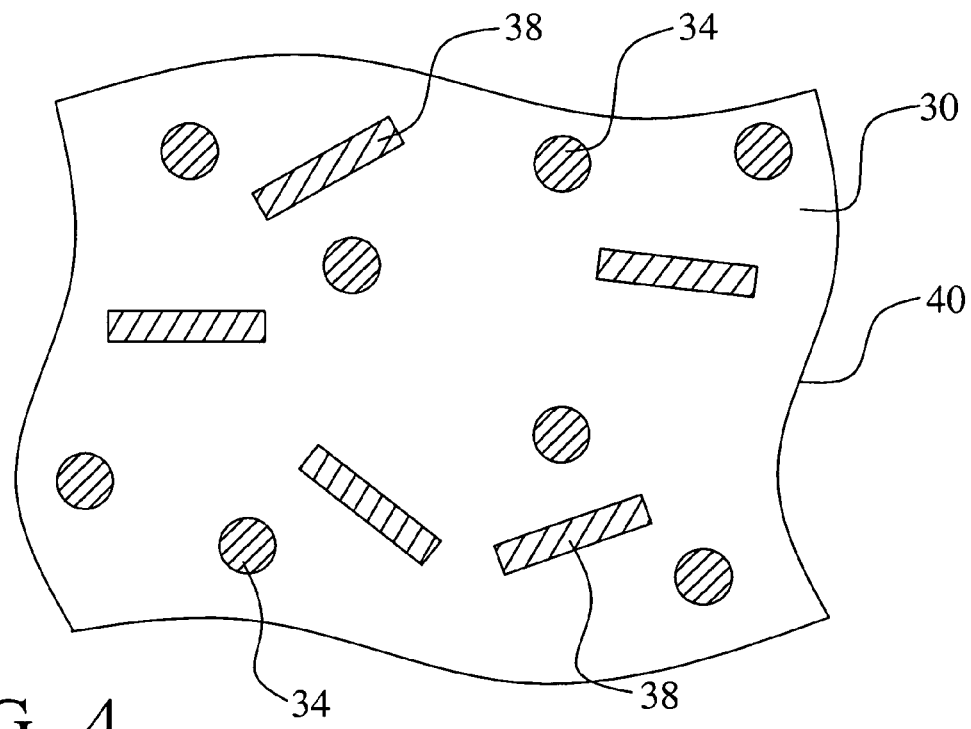
FIG. 4 illustrates a third preferred embodiment of a conductive loaded resin-based material wherein the conductive materials comprise both conductive powder and micron conductive fibers.

FIG. 3 shows a cross section view of an example of conductive loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
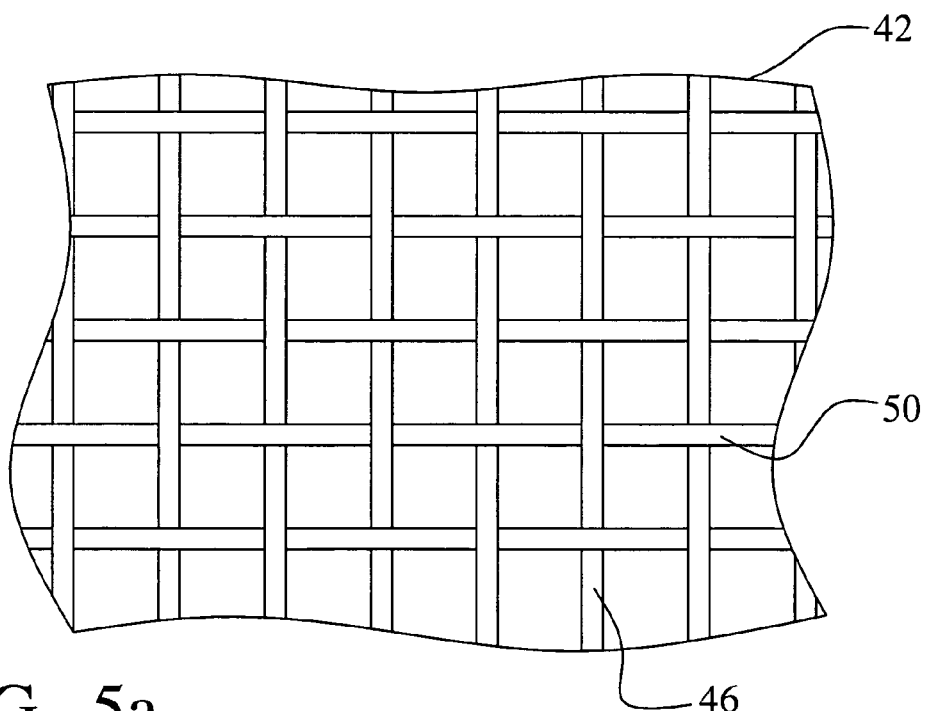

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown.

FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based materials(). This conductive fabric may then be cut into desired shapes and sizes.

Electromagnetic field absorbing devices formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the EMI absorbing devices are removed.

FIG. 6b shows a simplified schematic diagram of an extruder 70 for forming EMI absorbing devices if using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

As shown in the preferred embodiments, the novel methods and devices of the present invention provide an effective and manufacturable alternative to the prior art.

The advantages of the present invention may now be summarized. An effective electromagnetic absorbing device is achieved. A method to form an electromagnetic absorbing device is also achieved. The electromagnetic absorbing device is molded of conductive loaded resin-based materials. This electromagnetic absorbing device is molded of conductive loaded resin-based material where the characteristics can be altered by forming a metal layer over the conductive loaded resin-based material. In addition, methods to fabricate an electromagnetic absorbing device from a conductive loaded resin-based material incorporate various forms of the material. A method to fabricate an electromagnetic absorbing device from a conductive loaded resin-based material is achieved where the material is in the form of a fabric. The electromagnetic absorbing device is easily incorporated into the casing of an electronics circuit. An electromagnetic absorbing chamber for electronics product testing is achieved. An electromagnetic absorbing device is achieved that mimics a human body part.

While the invention has been particularly shown and described with reference to the preferred embodiments thereof, it will be understood by those skilled in the art that various changes in form and details may be made without departing from the spirit and scope of the invention.

What is claimed is:

1. An electromagnetic absorbing device comprising a conductive loaded, resin-based material comprising conductive materials in a base resin host wherein the ratio, by weight, of said conductive materials to said resin host is between about 0.20 and about 0.40.

2. The device according to claim 1 wherein said conductive materials comprise metal powder.

3. The device according to claim 2 wherein said metal powder is nickel, copper, or silver.

4. The device according to claim 2 wherein said metal powder is a non-conductive material with a metal plating.

5. The device according to claim 4 wherein said metal plating is nickel, copper, silver, or alloys thereof.

6. The device according to claim 2 wherein said metal powder comprises a diameter of between about 3 □m and about 12 □m.

7. The device according to claim 1 wherein said conductive materials comprise non-metal powder.

8. The device according to claim 7 wherein said non-metal powder is carbon, graphite, or an amine-based material.

9. The device according to claim 1 wherein said conductive materials comprise a combination of metal powder and non-metal powder.

10. The device according to claim 1 wherein said conductive materials comprise micron conductive fiber.

11. The device according to claim 10 wherein said micron conductive fiber is nickel plated carbon fiber, stainless steel fiber, copper fiber, silver fiber or combinations thereof.

12. The device according to claim 10 wherein said micron conductive fiber has a diameter of between about 3 □m and about 12 □m and a length of between about 2 mm and about 14 mm.

13. The device according to claim 1 wherein said conductive materials comprise a combination of conductive powder and conductive fiber.

14. The device according to claim 1 wherein said electromagnetic absorbing device is part of a casing for an electronic device.

15. The device according to claim 14 wherein said electronic device is a mobile communications device.

16. The device according to claim 1 wherein said electromagnetic absorbing device surrounds an integrated circuit device.

17. The device according to claim 1 further comprising a solderable layer overlying at least a part of said conductive loaded, resin-based material.

18. The device according to claim 1 wherein said electromagnetic absorbing device comprises a chamber capable of holding an electronic device under test.

19. The device according to claim 1 wherein said electromagnetic absorbing device mimics a human body part.

20. The device according to claim 19 wherein said human body part comprises a hand.

21. The device according to claim 19 wherein said human body part comprises a head.

22. The device according to claim 19 further comprising a flexible tendon structure embedded in said conductive loaded, resin-based material.

23. The device according to claim 19 wherein said conductive loaded, resin-based material is flexible.

24. The device according to claim 1 further comprising a metal layer overlying at least a part of said conductive loaded, resin-based material.

25. A mobile communications device comprising:
an electronic circuit; and
an electromagnetic absorbing device comprising a conductive loaded, resin-based material comprising conductive materials in a base resin host wherein the ratio, by weight, of said conductive materials to said resin host is between about 0.20 and about 0.40 and wherein said electromagnetic absorbing device comprises a part of the casing for said mobile communications device.

26. The device according to claim 25 wherein said conductive materials comprise metal powder.

27. The device according to claim 26 wherein said metal powder is a non-conductive material with a metal plating.

28. The device according to claim 25 wherein said conductive materials comprise non-metal powder.

29. The device according to claim 25 wherein said conductive materials comprise a combination of metal powder and non-metal powder.

30. The device according to claim 25 wherein said conductive materials comprise micron conductive fiber.

31. The device according to claim 25 wherein said conductive materials comprise a combination of conductive powder and conductive fiber.

32. The device according to claim 25 further comprising a metal layer overlying at least a part of said conductive loaded, resin-based material.

33. An electromagnetic absorbing device comprising a conductive loaded, resin-based material comprising conductive materials in a base resin host wherein the ratio, by weight, of said conductive materials to said resin host is between about 0.20 and about 0.40 and wherein said electromagnetic absorbing device mimics a part of the human body.

34. The device according to claim 33 wherein said conductive materials comprise metal powder.

35. The device according to claim 34 wherein said metal powder is a non-conductive material with a metal plating.

36. The device according to claim 33 wherein said conductive materials comprise non-metal powder.

37. The device according to claim 33 wherein said conductive materials comprise a combination of metal powder and non-metal powder.

38. The device according to claim 33 wherein said conductive materials comprise micron conductive fiber.

39. The device according to claim 33 wherein said conductive materials comprise a combination of conductive powder and conductive fiber.

40. The device according to claim 33 further comprising a metal layer overlying at least a part of said conductive loaded, resin-based material.

41. The device according to claim 33 wherein said human body part comprises a hand.

42. The device according to claim 33 wherein said human body part comprises a head.

43. The device according to claim 33 further comprising a flexible tendon structure embedded in said conductive loaded, resin-based material.

44. The device according to claim 33 wherein said conductive loaded, resin-based material is flexible.

45. A method to form an electromagnetic absorbing device, said method comprising:
providing a conductive loaded, resin-based material comprising conductive materials in a resin-based host; and
molding said conductive loaded, resin-based material into an electromagnetic absorbing device.

46. The method according to claim 45 wherein the ratio, by weight, of said conductive materials to said resin host is between about 0.20 and about 0.40.

47. The method according to claim 45 wherein the conductive materials comprise a conductive powder.

48. The method according to claim 45 wherein said conductive materials comprise a micron conductive fiber.

49. The method according to claim 45 wherein said conductive materials comprise a combination of conductive powder and conductive fiber.

50. The method according to claim 45 wherein said molding comprises:
injecting said conductive loaded, resin-based material into a mold; curing said conductive loaded, resin-based material; and
removing said electromagnetic absorbing device from said mold.

51. The method according to claim 45 wherein said molding comprises:
loading said conductive loaded, resin-based material into a chamber;
extruding said conductive loaded, resin-based material out of said chamber through a shaping outlet; and
curing said conductive loaded, resin-based material to form said electromagnetic absorbing device.

52. The method according to claim 51 further comprising stamping or milling said molded conductive loaded, resin-based material.

* * * * *